United States Patent [19]
Ma et al.

[11] Patent Number: 5,936,261
[45] Date of Patent: Aug. 10, 1999

[54] ELEVATED IMAGE SENSOR ARRAY WHICH INCLUDES ISOLATION BETWEEN THE IMAGE SENSORS AND A UNIQUE INTERCONNECTION

[75] Inventors: Shawming Ma, Sunnyvale; Jeremy A. Theil, Mountain View, both of Calif.

[73] Assignee: Hewlett-Packard Company, Palo Alto, Calif.

[21] Appl. No.: 09/195,535

[22] Filed: Nov. 18, 1998

[51] Int. Cl.[6] .................................................. H01L 31/20
[52] U.S. Cl. .............................. 257/59; 257/72; 257/88; 257/184; 257/226; 257/233; 257/234; 257/290; 257/291; 257/292; 257/293
[58] Field of Search .................................. 257/59, 72, 88, 257/184, 226, 233, 234, 290–293

[56] References Cited

U.S. PATENT DOCUMENTS 5,213,984  5/1993  Okada et al. ................. 437/2

OTHER PUBLICATIONS

Silicon Vision GmbH13 TFA Technology—a–Si:H Photodetectors, pp. 1–6, GIF image 761×413 pixels; Thin Film Technology pp. 1–2, GIF image 901×457 pixels; Archive–Index, p. 1.

Q. Zhu, T. Lule, H. Stiebig, T. Martin, J. Giehl, J. Zhou, H. Fisher, M. Bohm—Universtat–GH Siegen, Institut fur Halbleiterelektronik (IHE), D–57068, Siegen, Germany; pp. 727–729.

*Primary Examiner*—Fetsum Abraham
*Attorney, Agent, or Firm*—Brian R. Short

[57] ABSTRACT

An image sensor. The image sensor array includes a substrate. An interconnect structure is formed adjacent to the substrate. A plurality of image sensors are formed adjacent to the interconnect structure. Each image sensor includes a pixel electrode, and a separate I-layer section formed adjacent to the pixel electrode. The image sensor array further includes an insulating material between each image sensor. A transparent electrode is formed over the image sensors. An inner surface of the transparent electrode is electrically connected to an outer surface of the image sensors and the interconnect.

17 Claims, 19 Drawing Sheets

ELEVATED IMAGE SENSOR ARRAY WHICH INCLUDES ISOLATION BETWEEN THE IMAGE SENSORS AND A UNIQUE INTERCONNECTION

RELATED APPLICATIONS

The present application is related to the following co-pending Patent Application, which is incorporated in its entirety into the present application herewith:

1. Patent Application entitled, "AN ELEVATED PIN DIODE ACTIVE PIXEL SENSOR WHICH INCLUDES A PATTERNED DOPED SEMICONDUCTOR ELECTRODE", Filed Oct. 19, 1998, application Ser. No. 09/174,717.

FIELD OF THE INVENTION

This invention relates generally to PIN photo diode image sensors. In particular, it relates to a plurality of elevated PIN diodes image sensors in which each diode image sensor is isolated from other diode image sensors, and in which the diode image sensors include a unique bias interconnection structure.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the images. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a cross-section of a prior art array of image sensors. This array of image sensors includes PIN diode sensors located over a substrate 10. An interconnection structure 12 electrically connects an N-layer 14 of the PIN diodes to the substrate 10. An I-layer 16 is formed over the N-layer 14. A P-layer 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A transparent conductive layer 24 is located over the array of diode sensors. A conductive lead 26 is connected to the transparent conductive layer 24. The conductive lead 26 is connected to a bias voltage which allows biasing of the P-layer 18 of the array of PIN diode sensors to a selected voltage potential.

A limitation of the image sensor structure of FIG. 1 is the electrical connection between the conductive lead 26 and the transparent conductive layer 24. The transparent conductive layer 24 must be electrically conductive to allow biasing of the PIN diodes, and must be transparent to allow the PIN diodes to receive light. Generally, it is very difficult to bond to the types of materials that must be used to form the transparent conductive layer 24. Therefore, the conductive lead 26 must be attached to the transparent conductive layer 24 with the aid of some type of clamp or support structure. The result being an electrical connection which is not reliable and which is expensive to produce.

Another limitation of the image sensor structure of FIG. 1 is that the individual image sensors are not isolated from each other. That is, light received by a given image sensor will effect neighboring image sensors because current can flow through the N-layer 14 between neighboring image sensors. Charge can flow between the image sensors especially when the light intensity of the received light varies greatly between neighboring image sensors. The P-layer 18, the I-layer 16 and the N-layer 14 are shared by neighboring image sensors. A trench 28 is formed to provide some isolation between the image sensors by increasing the resistance between the N-layers sections of neighboring image sensors.

It is desirable to have a plurality of active pixel sensors formed adjacent to a substrate in which a transparent conductive layer is reliably electrically connected between the pixel sensors and to a pixel sensor bias voltage which originates on the substrate. It is also desirable that the pixel sensors be isolated from each other to reduce coupling between the pixel sensors.

SUMMARY OF THE INVENTION

The invention includes a plurality of image sensors formed adjacent to a substrate. A transparent conductive layer is reliably electrically connected between the image sensors and to a image sensor bias voltage which originates on the substrate. The image sensors are isolated from each other which reduces coupling between the image sensors.

A first embodiment includes an image sensor array. The image sensor array includes a substrate. An interconnect structure is formed adjacent to the substrate. A plurality of image sensors are formed adjacent to the interconnect structure. Each image sensor includes a pixel electrode, and a separate I-layer section formed adjacent to the pixel electrode. The image sensor array further includes an insulating material between each image sensor. A transparent electrode is formed over the image sensors. An inner surface of the transparent electrode is electrically connected to an outer surface of the image sensors and the interconnect structure.

A second embodiment is similar to the first embodiment. Each image sensor of the second embodiment includes a separate P-layer section formed adjacent to the I-layer section.

A third embodiment is similar to the first embodiment. Each image sensor of the second embodiment includes a P-layer wherein the P-layer extends adjacently to a plurality of separate I-layer sections.

A fourth embodiment is similar to the first embodiment. The second embodiment includes the each pixel electrode consisting of an n-layer.

A fifth embodiment is similar to the first embodiment. The third embodiment includes the I-layer sections and the pixel electrodes consisting of amorphous silicon.

Other aspects and advantages of the present invention will become apparent from the following detailed description, taken in conjunction with the accompanying drawings, illustrating by way of example the principles of the invention.

DETAILED DESCRIPTION

Figure 1:
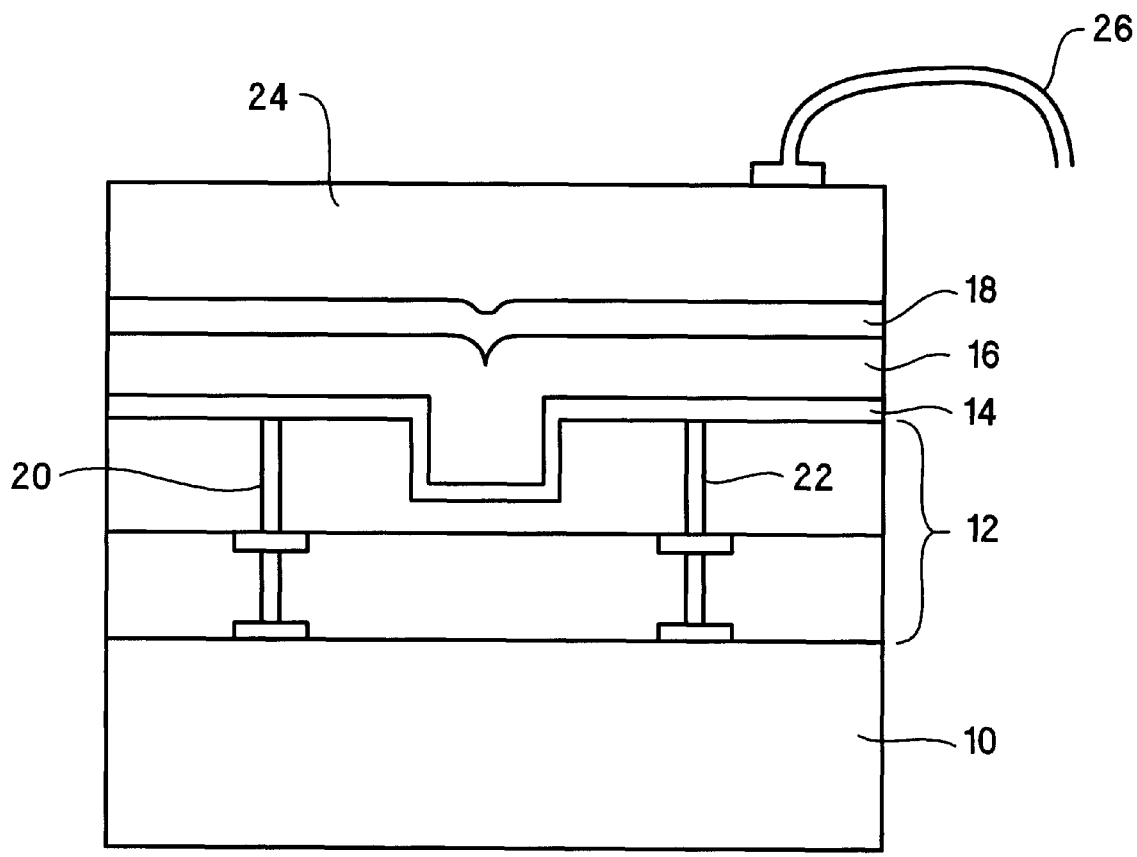
FIG. 1 shows a cross-section of a prior art array of image sensors.

As shown in the drawings for purposes of illustration, the invention is embodied in an elevated image sensor array adjacent to a substrate which includes isolation between the image sensors and which includes a reliable and easy to manufacture bias connection between the image sensors and a sensor bias voltage located on the substrate.

Figure 2:
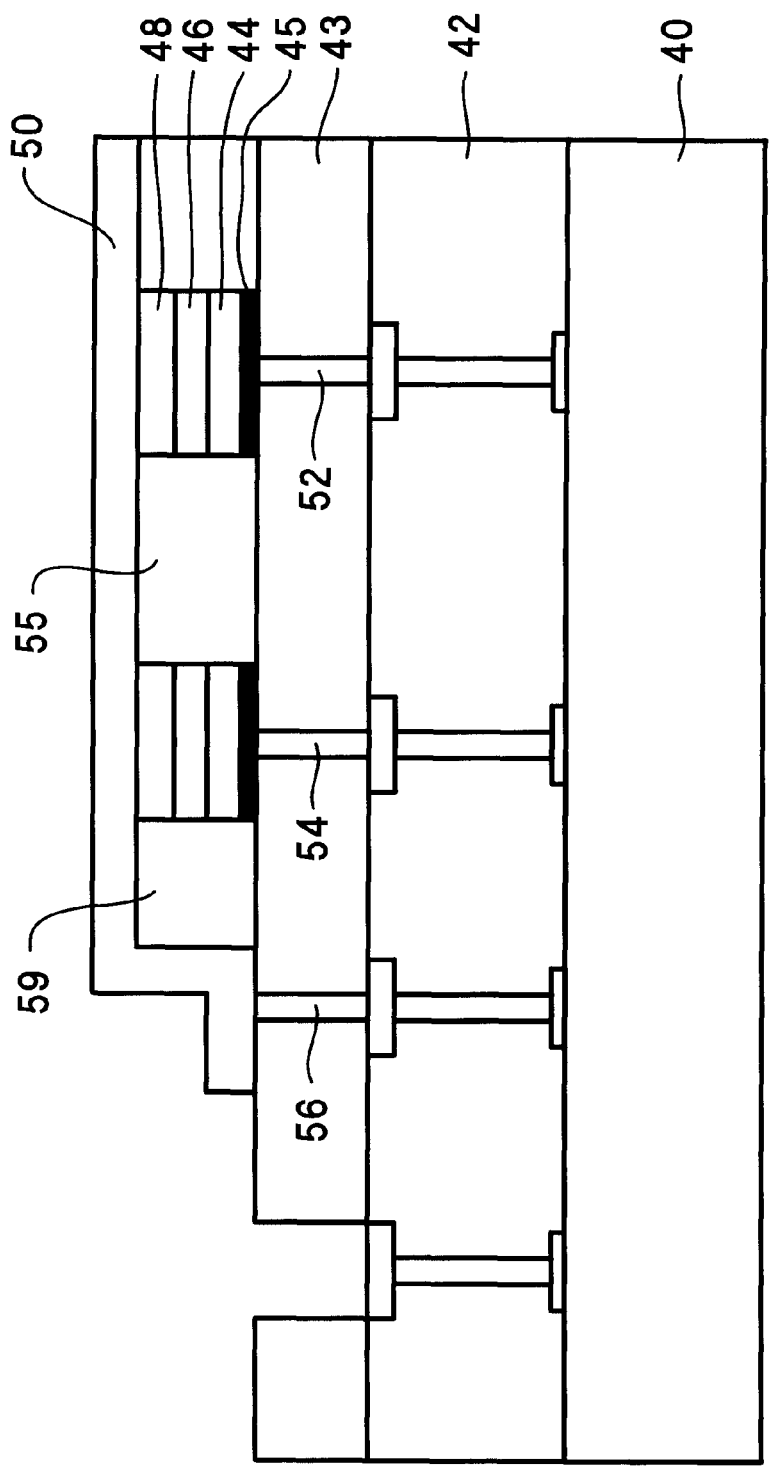
FIG. 2 shows an embodiment of the invention.

FIG. 2 shows a first embodiment of the invention. This embodiment includes a substrate 40. An interconnection structure 42 is formed adjacent to the substrate 40. A pixel interconnect structure 43 is formed adjacent to the interconnection structure 42. Inner metal sections 45 and pixel electrodes 44 are formed adjacent to the pixel interconnect structure 43. I-layer sections 46 are adjacent to the pixel electrodes 44. P-layer sections 48 are adjacent to the I-layer sections 46. Each image sensor of an array of image sensors includes an individual inner metal section 45, a pixel electrode 44, an I-layer section 46 and a P-layer section 48. A transparent conductor 50 is formed adjacent to the P-layer sections 48. Insulating regions 55 are located between the image sensors. The pixel electrode 44 of a first image sensor is electrically connected to the substrate 40 through a first conductive via 52. The pixel electrode 44 of a second image sensor is electrically connected to the substrate 40 through a second conductive via 54. The transparent conductor 50 is electrically connected to the substrate 40 through a third conductive via 56.

The image sensors conduct charge when the image sensors receive light. The substrate 40 generally includes sense circuitry and signal processing circuitry. The sense circuitry senses how much charge the image sensors have conducted. The amount of charge conducted represents the intensity of light received by the image sensors. Generally, the substrate can be CMOS (complementary metal oxide silicon), BiC-MOS or Bipolar. The substrate can include various types of substrate technology including charged coupled devices.

Typically, the interconnection structure 42 is a standard CMOS interconnection structure. The structure and methods of forming this interconnection structure are well known in the field of electronic integrated circuit fabrication. The interconnection structure 42 can be a subtractive metal structure, or a single or dual damascene structure.

The pixel interconnect structure 43 provides reliability and structural advantages to the elevated image sensor structure. The pixel interconnect structure allows for the formation of thin pixel electrodes 44 because the pixel electrodes 44 are formed over silicon rather that a metal pad located on the interconnection structure 42. The pixel interconnect structure 43 electrically connects the pixel electrodes 44 to the interconnection structure 42. The pixel interconnect structure 43 is typically formed from a dielectric film, for example, polyimide, silicon oxide or a silicon nitride.

The conductive vias 52, 54 pass through the pixel interconnect structure 43 and electrically connect the pixel electrodes 44 to the substrate 40. The third conductive via 56 passes through the pixel interconnect structure 43 and provides a reliable electrical connection between the transparent conductor 50 and the substrate 40. Typically, the conductive vias 52, 54, 56 are formed from tungsten. Tungsten is generally used during fabrication because tungsten can fill high aspect ratio holes. That is, tungsten can be used to form narrow and relatively long interconnections. Typically, the conductive vias 52, 54, 56 are formed using a chemical vapor deposition (CVD) process. Other materials which can be used to form the conductive vias 52, 54, 56 include copper, aluminum or any other electrically conductive material.

There are several structural advantages to having the pixel interconnect structure 43 between the pixel electrodes 44 and the substrate 40. This structure allows the interconnection circuitry to be tightly packed. First of all, lateral space is conserved because the vias 52, 54, 56 are located directly underneath the pixel electrodes. Secondly, the structure allows the formation of vias 52, 54, 56 having a minimal diameter. CVD processes are generally the best method of forming the vias 52, 54, 56. A Tungsten CVD process allows for the formation of small diameter vias. However, the temperatures required to form tungsten vias with a CVD process are greater than many of the materials (amorphous silicon for example) to form the pixel electrodes can withstand. By forming the pixel interconnect structure 43 over the substrate 40, and the pixel electrodes 44 over the pixel interconnect structure 43, the vias 52, 54, 56 can be formed before the pixel electrodes 44, and therefore, the pixel electrodes 44 are not subjected to the high temperatures required for the formation of the vias 52, 54, 56.

The inner metal sections 45 should include a thin conductive material. The inner metal sections 45 may be formed, for example, from a degenerately doped semiconductor layer, aluminum, titanium, titanium nitride, copper or tungsten. The inner metal sections 45 should be thin (approximately 500 Angstroms) and smooth. The inner metal sections 45 should be smooth enough that any surface roughness is substantially less than the thickness of the pixel electrodes 44 formed over the inner metal sections 45. To satisfy the smoothness requirement, polishing of the inner metal sections 45 may be required.

The inner metal sections 45 can be optional. However, the inner metal sections 45 have a lower resistance than the materials used to form the pixel electrodes 44. Therefore, the inner metal sections 45 provide better current collection.

The pixel electrodes 44 are generally formed from a doped semiconductor. The doped semiconductor can be an N-layer of amorphous silicon. The pixel electrodes must be thick enough, and doped heavily enough that the pixel electrodes 44 do not fully deplete when biased during operation. The pixel electrodes 44 are typically doped with phosphorous.

The pixel electrodes 44 are typically deposited using plasma etched chemical vapor deposition (PECVD). A silicon containing gas (such as $Si_2H_6$ or $SiH_4$) is included when forming amorphous silicon pixel electrodes. When forming N-layer pixel electrodes, the PECVD process is performed with a phosphorous containing gas (such as $PH_3$).

An N-layer of amorphous silicon is typically used when forming PIN diode image sensors. However, the diode image sensors can include an NIP sensor configuration. In this case, the pixel electrodes 44 are formed from a P-layer, and the P-layer sections 48 of FIG. 2 are replaced with N-layer sections.

The I-layer sections 46 are generally formed from hydrogenated amorphous silicon. The I-layer sections 46 can be deposited using a PECVD process or a reactive sputtering process. The PECVD process must include a silicon containing gas. The deposition should be at a low enough temperature that hydrogen is retained within the film. The I-layer sections 46 typically on the order of one micron thick.

The P-layer sections 48 are generally formed from amorphous silicon. Typically, the P-layer sections 48 are doped with Boron.

The P-layer sections 48 can deposited using a PECVD process. The PECVD process is performed with a Boron containing gas. The Boron containing gas can be $B_2H_6$. A silicon containing gas is included when forming amorphous silicon P-layer sections 48. The thickness of the P-layer sections 48 must generally be controlled to ensure that the P-layer sections 48 do not absorb too much short wavelength (blue) light.

Another embodiment of the invention does not include P-layer sections 48. The P-layer sections can be eliminated with proper selection of the composition of the material within the transparent conductor 50, and proper selection of the doping levels of the pixel electrodes 44. For this embodiment, the transparent conductor 50 provides a conductive connection between a top surface of the I-layer sections 46 of the image sensors and the interconnection structure 42, rather than just between an edge surface of the I-layer sections 46 and the interconnection structure 42.

The insulating regions 55 provide isolation between the image sensors formed by the electrodes 44, the I-layer sections 46 and the P-layer sections 48. That is, the insulating regions 55 provide isolation between the image sensors. The insulating regions 55 are typically formed from $SiO_2$, $Si_3N_4$ or a combination of $SiO_2$ and $Si_3N_4$. An edge insulating region 59 is located between second pixel sensor which is electrically connected to the substrate 40 through the second conductive via 54, and the transparent conductor 50. An embodiment of the invention includes the edge insulating region 59, and another embodiment does not include the edge insulating region 59.

As previously described, the pixel electrodes 44, the I-layer sections 46 and the P-layer sections 48 are generally formed from amorphous silicon. However, the pixel electrodes 44, the I-layer sections 46 and the P-layer sections 48 can also be formed from amorphous carbon, amorphous silicon carbide, amorphous germanium, or amorphous silicon-germanium. It should be understood that this list is not exhaustive.

The transparent conductor 50 provides a conductive connection between the P-layer sections 48 and the interconnection structure 42. Light must pass through the transparent conductor 50 which is received by the image sensors. Generally, the transparent conductor 50 is formed from an indium tin oxide. However, the transparent conductor 50 can also be formed from titanium nitride, thin silicide, or certain types of transition metal nitrides or oxides.

Both the selection of the type of material to be used within the transparent conductor 50, and the determination of the desired thickness of the transparent conductor 50, are based upon minimizing the optical reflection of light received by the image sensor. Minimization of the reflection of light received by the image sensor helps to optimize the amount of light detected by the image sensor.

The transparent conductor 50 can be deposited by a sputtering process. Deposition through sputtering is well known in the art of integrated circuit fabrication.

A protective layer may be formed over the transparent conductor 50. The protective layer provides mechanical protection, electrical insulation, and can provide some antireflective characteristics.

Another embodiment includes Schottky diode sensors. Schottky diode sensors include several different configurations. A first Schottky diode configuration includes the electrodes 44 being formed from a conductive metal. This configuration also includes the I-layer sections 46 and the P-layer sections 48. A second Schottky diode configuration includes the electrodes 44 being formed from a conductive metal and the P-layer sections 48 being replaced with a transparent conductive layer sections or a transparent silicide. A third Schottky diode configuration includes the electrodes 44 being formed from N-layer sections, and the P-layer sections being replaced with transparent conductive layer sections. The transparent conductive layer sections of the third configuration must exhibit a proper work function. Conductive metals which may be used for the Schottky configurations include chrome, platinum, aluminum and titanium.

Figure 3:
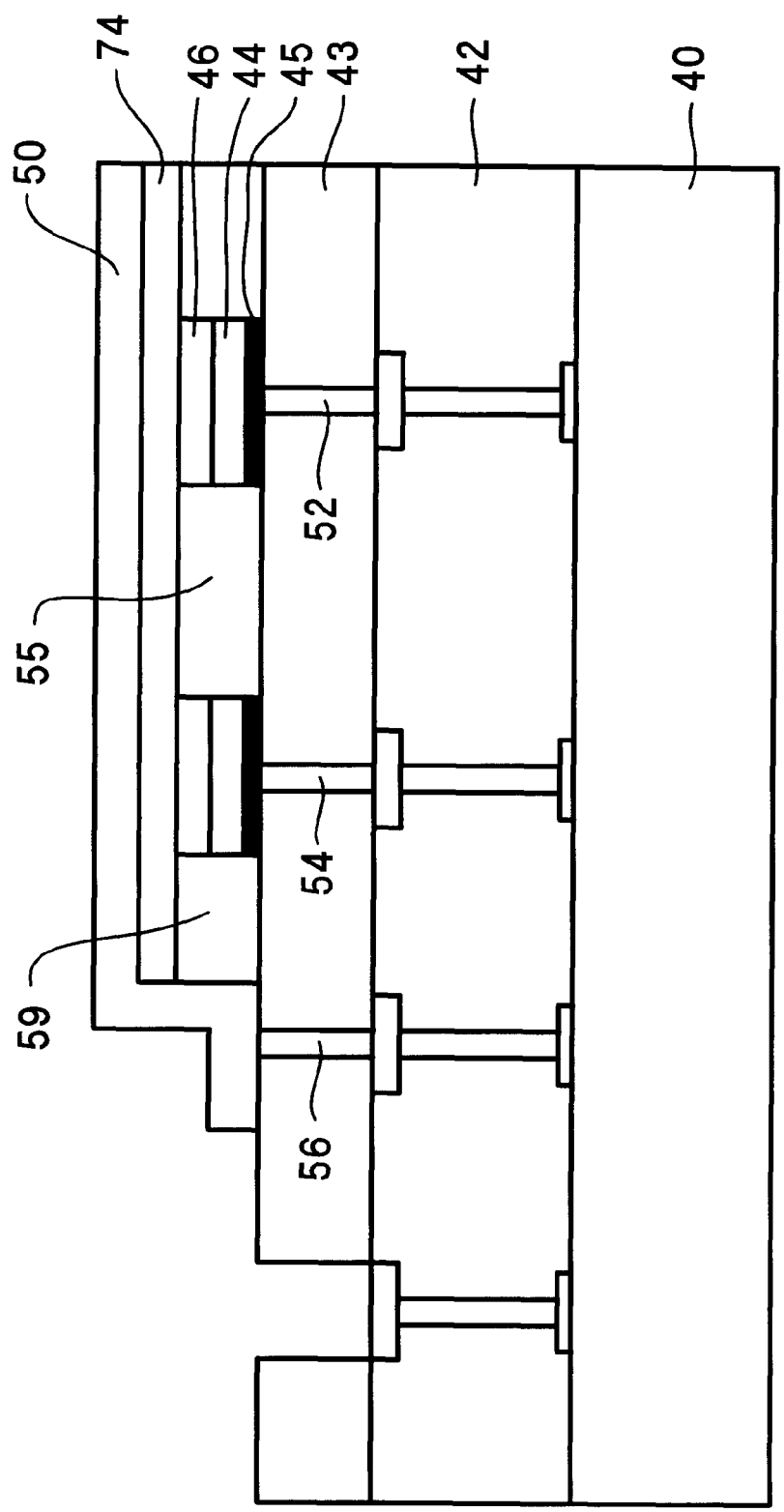
FIG. 3 shows another embodiment of the invention.

FIG. 3 shows another embodiment of the invention. For this embodiment, rather than each image sensor including an individual P-layer section, a single P-layer 74 is formed adjacent to the I-layer sections of a plurality of image sensors of the array of image sensors. That is, several PIN diode sensor image sensors share a common P-layer 74.

The P-layer 74 is generally deposited after the formation of the electrodes 44 and the I-layer sections 46. The electrodes 44 and the I-layer sections 46 can generally be formed without having to remove the substrate 40 from a vacuum environment. However, the formation of the P-layer 74 generally does require removal of the substrate 40 from a vacuum environment. The breaking of the vacuum environment may result in high interfacial state density between the P-layer 74 and the I-layer sections 46.

The processing steps required to form the insulating regions 55 generally require polishing of the insulating regions 55. For this embodiment, the polishing of the insulating regions 55 generally occurs before the deposition of the P-layer 74. Therefore, the thickness of the P-layer 74 is generally easier to control than the thickness of the P-layer sections 48 of the embodiment of FIG. 2.

The formation of the P-layer 74 rather than P-layer sections provides a more uniform surface for the transparent conductor 50 to adhere. That is, the transparent conductor 50 must only adhere to a single uniform P-layer 74 rather than to the P-layer sections 48 and the insulating regions 55.

FIGS. 4–10 show processing steps which can be used to fabricate the embodiment shown in FIG. 2.

Figure 4:
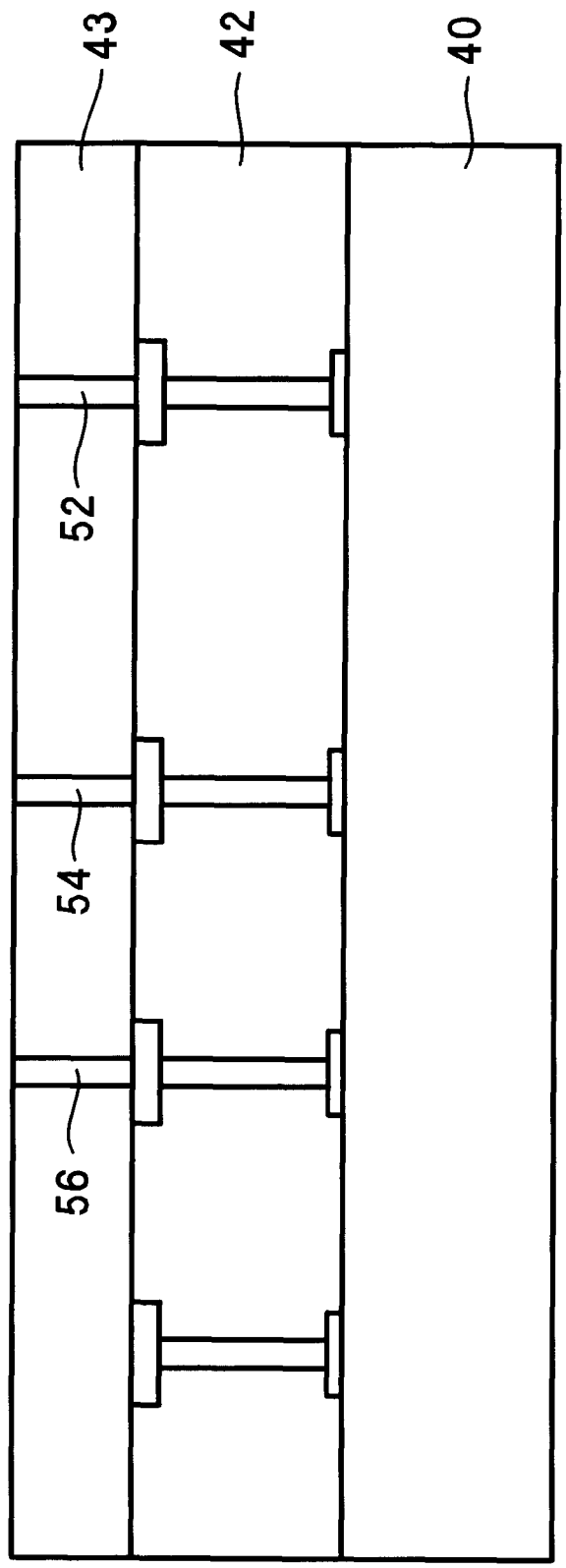
FIG. 4 shows a substrate with a standard interconnection structure and a pixel interconnect structure formed over the substrate.

FIG. 4 shows a substrate 40 with a standard interconnection structure 42 and a pixel interconnect structure 43 formed over the substrate 40. The structure and methods of forming this interconnection structure are well known in the field of electronic integrated circuit fabrication. The interconnection structure 42 can be a subtractive metal structure, or a single or dual damascene structure. The pixel interconnect structure 43 is typically formed from a silicon oxide or a silicon nitride.

The pixel interconnect structure 43 includes conductive vias 52, 54, 56. Generally, the conductive vias 52, 54, 56 are formed from tungsten. Tungsten is generally used because during fabrication, tungsten can fill high aspect ratio holes. That is, tungsten can be used to form narrow and relatively long interconnections. Typically, the conductive vias 52, 54, 56 are formed using a chemical vapor deposition (CVD) process. Other materials which can be used to form the conductive vias 52, 54, 56 include copper, aluminum or any other electrically conductive material.

Figure 5:
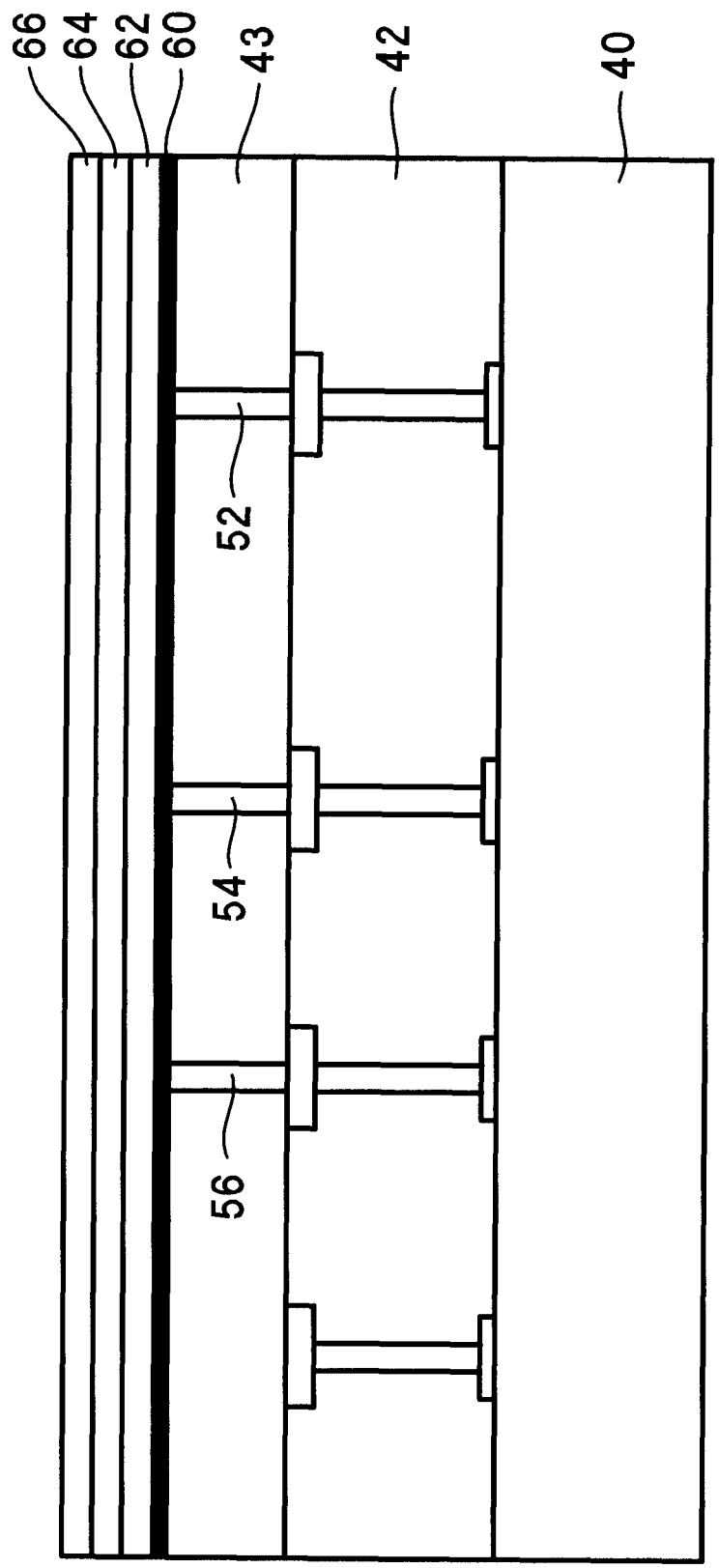
FIG. 5 shows an inner metal layer, a pixel electrode layer, a I-layer and a P-layer deposited over the pixel interconnect structure.

FIG. 5 shows an inner metal layer 60, a pixel electrode layer 62, a I-layer 64 and a P-layer 66 deposited over the pixel interconnect structure 43. The inner metal layer 60 is typically deposited by a sputtering process.

The pixel electrode layer 62 is typically deposited using a PECVD process. The PECVD process is performed with a phosphorous containing gas. The phosphorous containing gas can be $PH_3$. A silicon containing gas, such as $Si_2H_6$ or $SiH_4$, is included when forming amorphous silicon pixel electrodes 44.

The I-layer 64 is generally deposited using a PECVD process or reactive sputtering process. The PECVD process must include a silicon containing gas. The deposition should be at a low enough temperature that hydrogen is retained within the film.

The P-layer 66 can also be deposited using a PECVD process. The PECVD process is performed with a Boron containing gas. The Boron containing gas can be $B_2H_6$. A silicon containing gas is included when forming an amorphous silicon P-layer 66.

Figure 6:
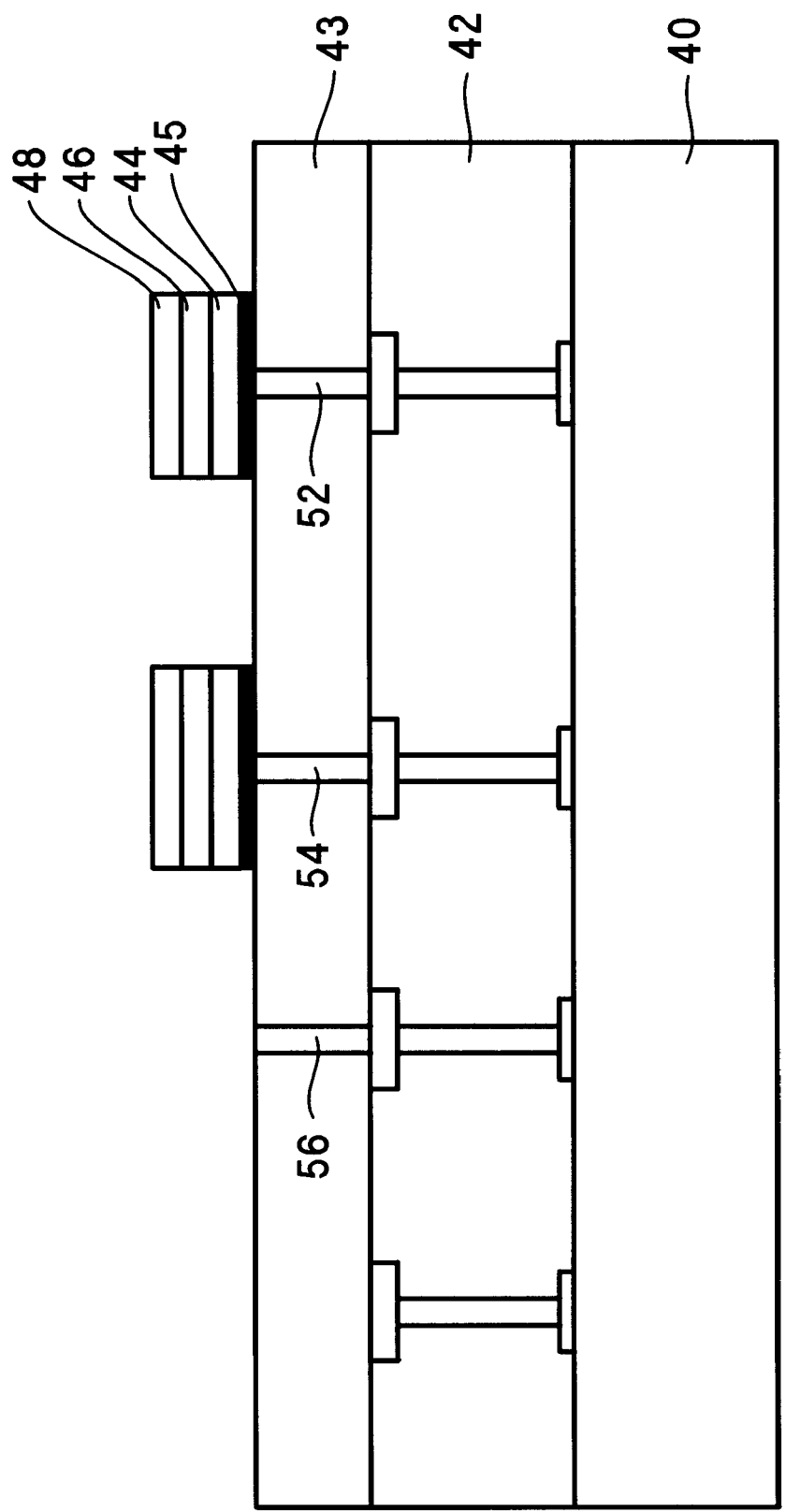
FIG. 6 shows the inner metal layer, the pixel electrode layer, the I-layer and the P-layer having been etched forming the image sensors according to a predetermined pattern.

FIG. 6 shows the inner metal layer 60, the pixel electrode layer 62, the I-layer 64 and the P-layer 66 having been wet or dry etched forming the image sensors according to a predetermined pattern.

Figure 7:
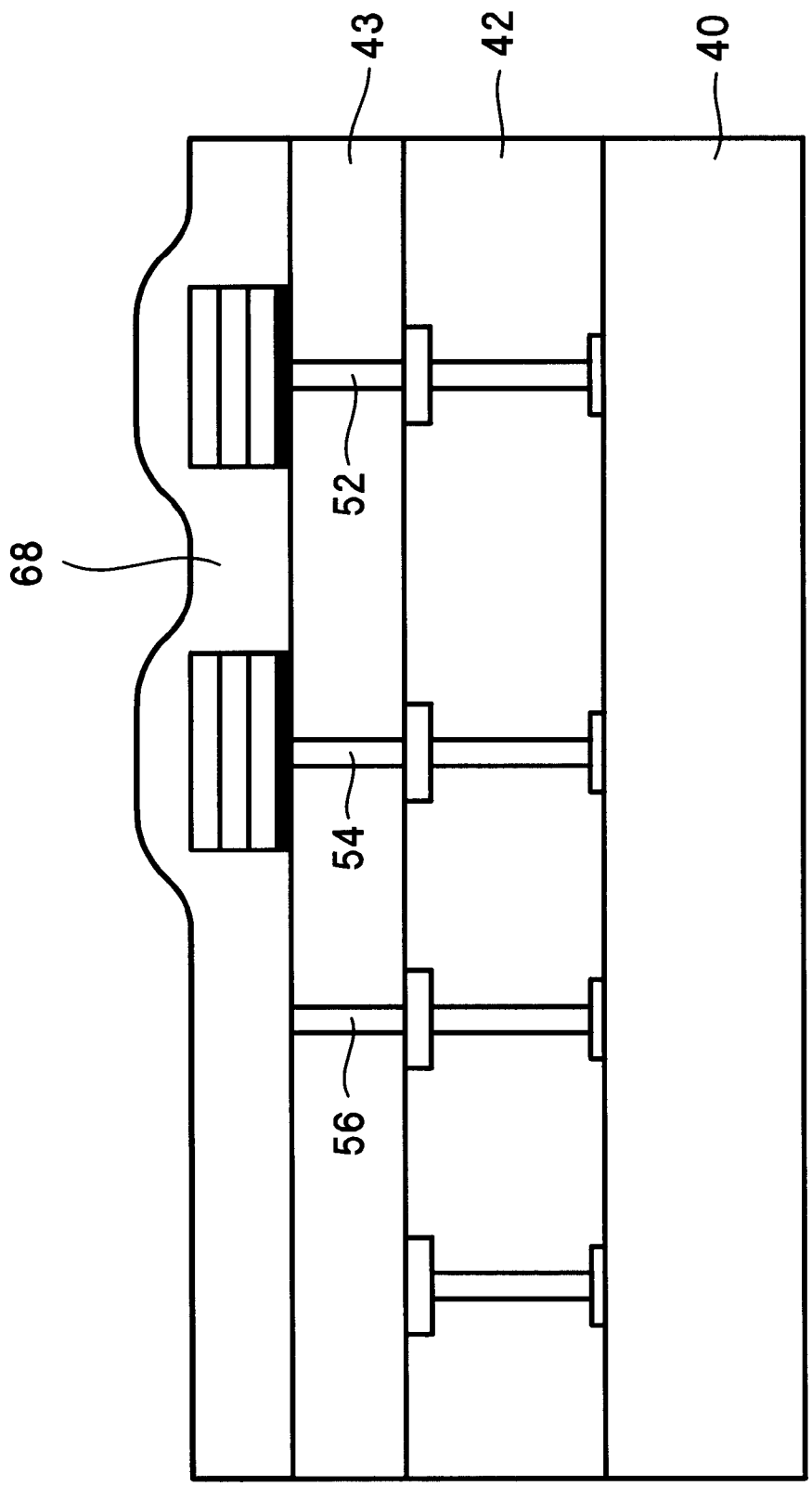
FIG. 7 shows the deposition of an insulating layer.

FIG. 7 shows the deposition of an insulating layer 68. The insulating layer 68 is deposited by a PECVD process. The insulating layer 68 is typically formed from $SiO_2$, $Si_3N_4$ or a combination of $SiO_2$ and $Si_3N_4$. The insulating layer 68 fills in gaps between the image sensors and is used to form the insulating regions 55.

Figure 8:
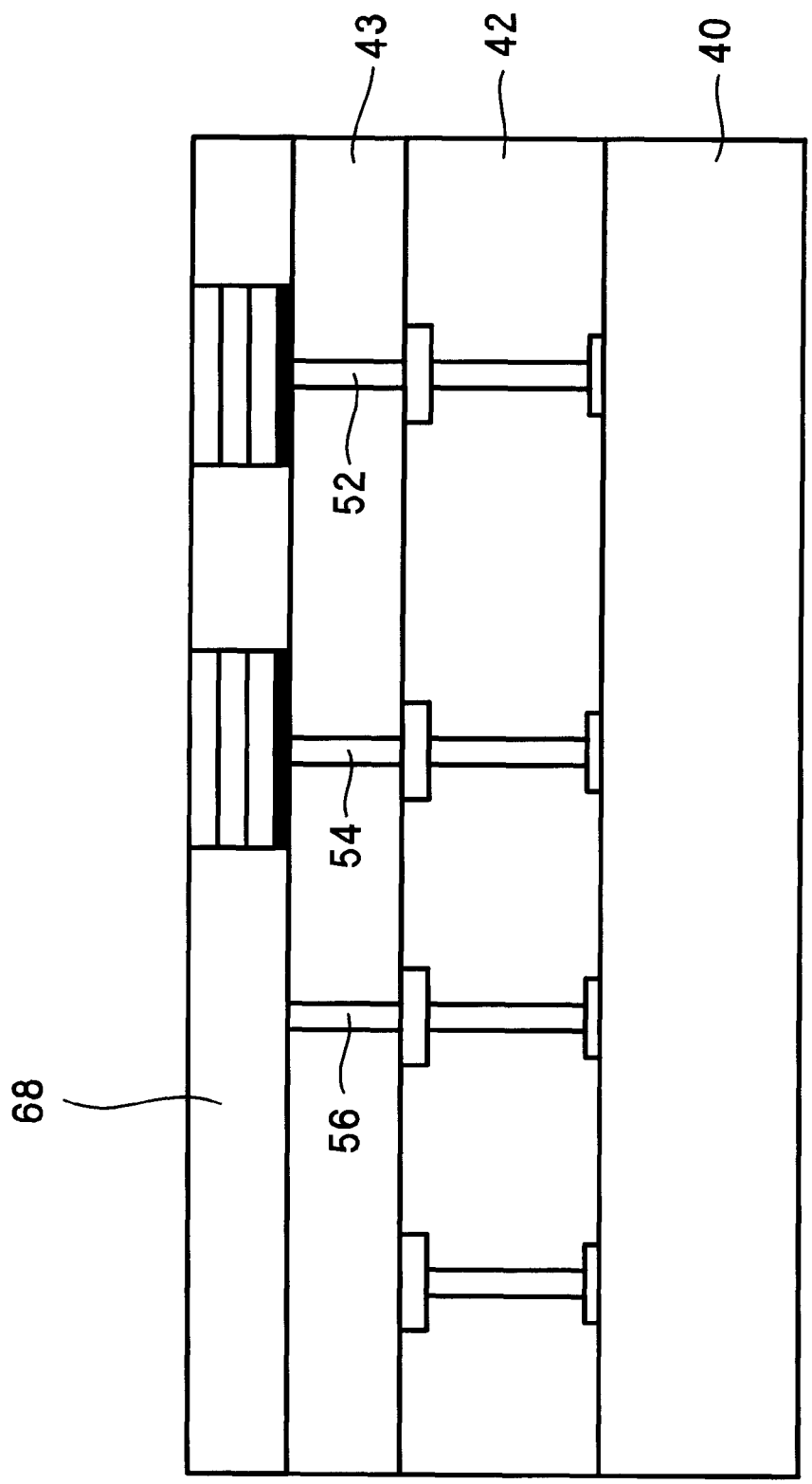
FIG. 8 show the deposition layer having been polished to expose the P-layer.

FIG. 8 shows the insulating layer 68 having been polished or etched forming the insulating regions 55.

Figure 9:
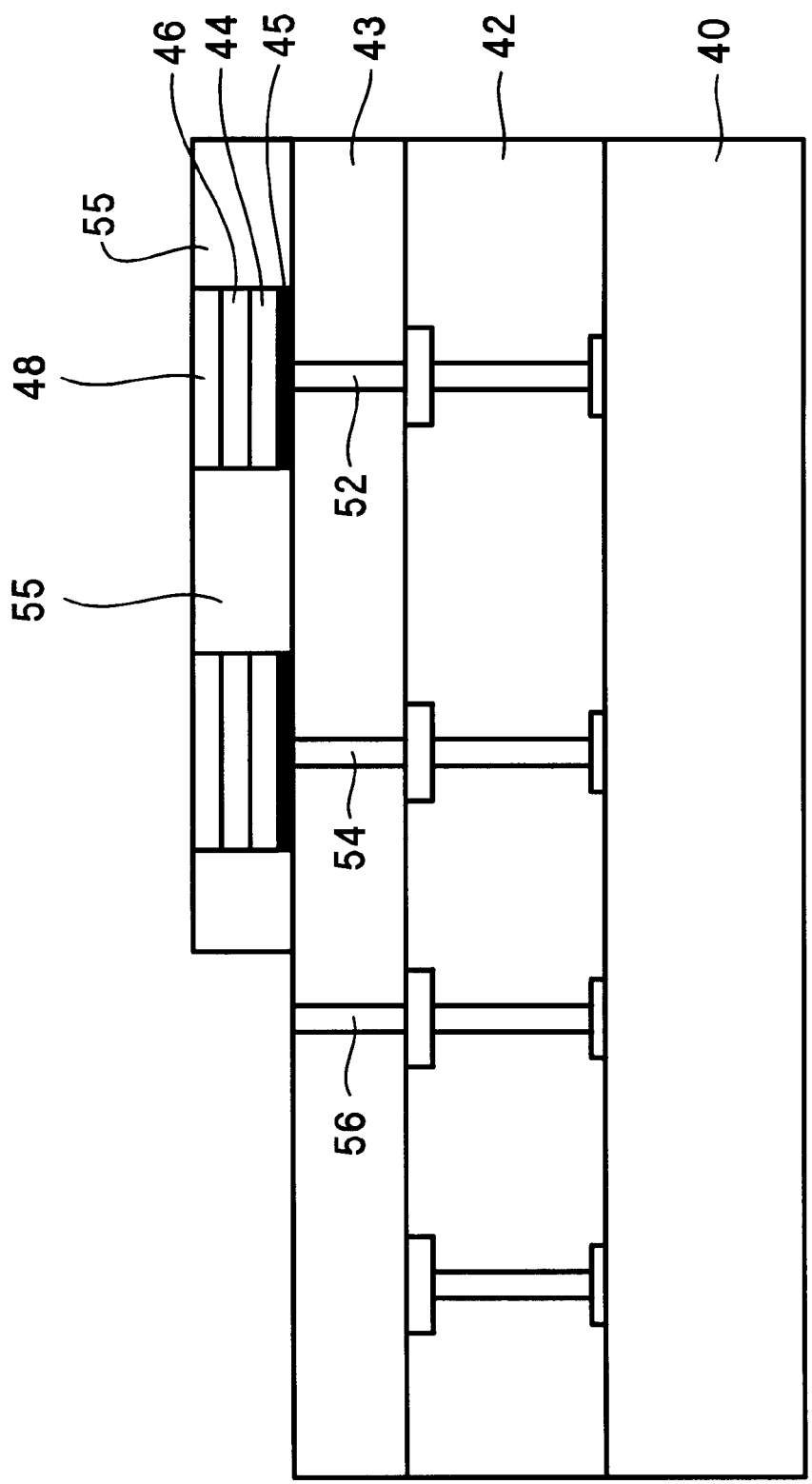
FIG. 9 shows the insulating layer having been etched forming insulating regions and providing access to the third conductive via.

FIG. 9 shows the insulating layer 68 having been further etched providing access to the third conductive via 56.

Figure 10:
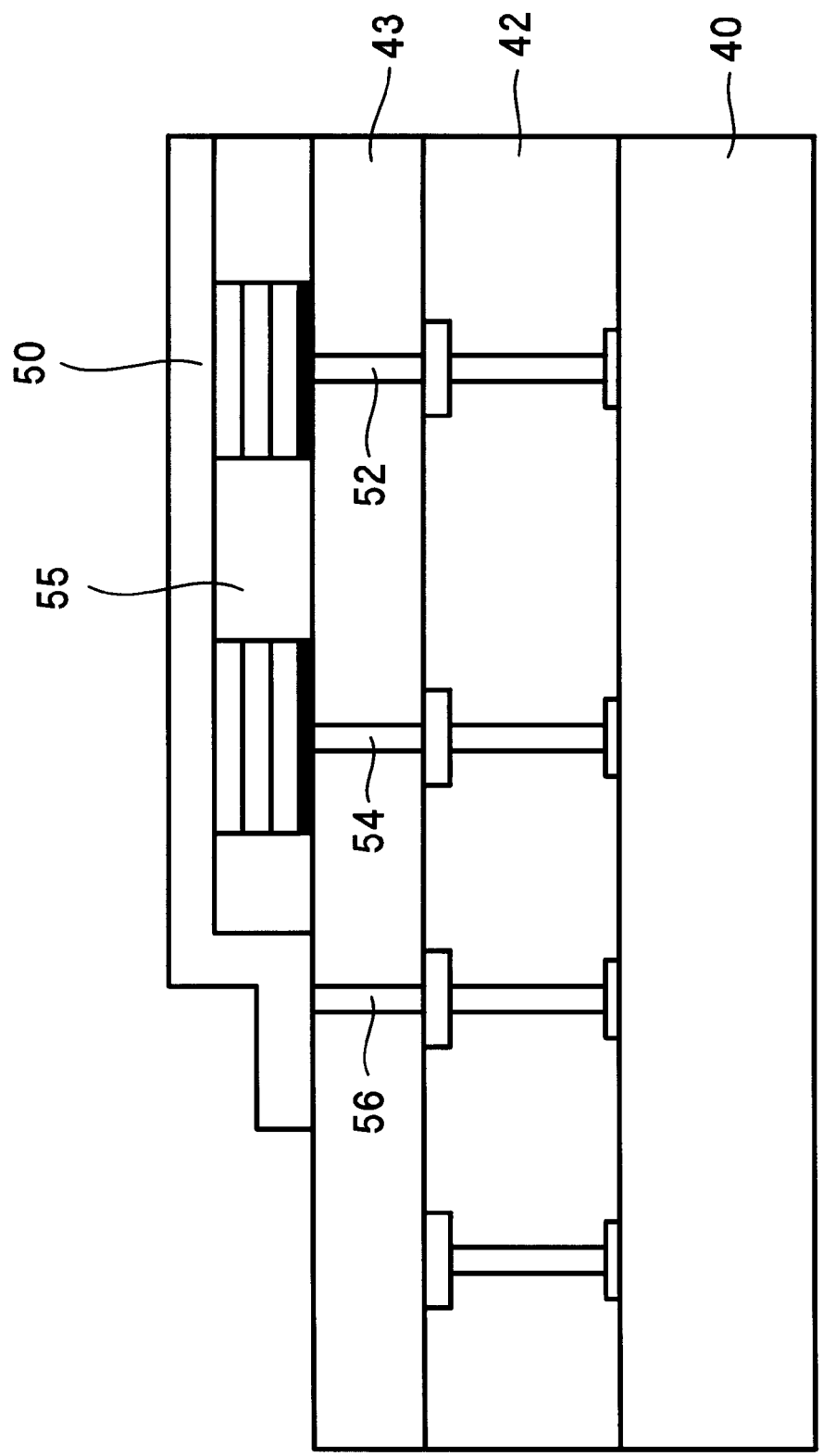
FIG. 10 shows the transparent conductive layer deposited over the P-layer sections which provides an electrical connection between the P-layer sections and the third conductive via.

FIG. 10 shows the transparent conductive layer 50 deposited over the P-layer sections 48 which provides an electrical connection between the P-layer sections 48 and the conductive via 56. Generally, the transparent conductor 50 is formed from an indium tin oxide. However, the transparent conductor 50 can also be formed from titanium nitride, thin silicide, or certain types of transition metal nitrides or oxides.

The transparent conductive layer 50 is generally deposited through reactive sputtering. However, the transparent conductive layer 50 can also be grown by evaporation. If the transparent conductive layer 50 is formed from titanium nitride, then typically a CVD process or a sputtering process must be used to deposit the transparent conductive layer 50.

Figure 11:
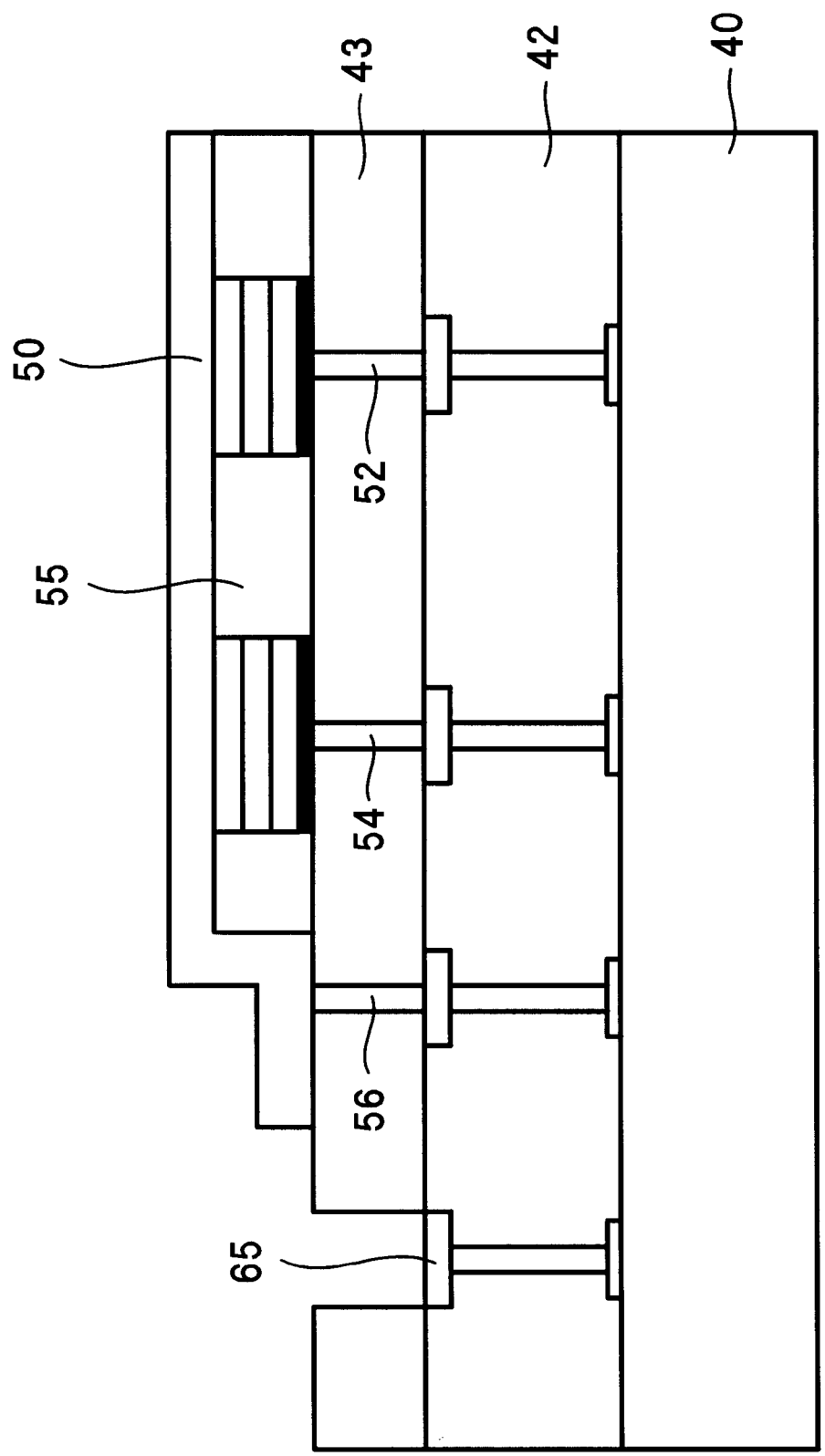
FIG. 11 shows the transparent conductive layer and the pixel interconnect structure having been etched according to a predetermined pattern.

FIG. 11 shows the transparent conductive layer 50 and the pixel interconnect structure 43 having been etched according to a predetermined pattern. This etching allows access to a bonding pad 65 of the interconnection structure 40.

As stated previously, a protective layer may be formed over the transparent conductor 50. The protective layer provides mechanical protection, electrical insulation, and can provide some anti-reflective characteristics.

FIGS. 12–19 show processing steps which can be used to fabricate the embodiment shown in FIG. 3.

Figure 12:
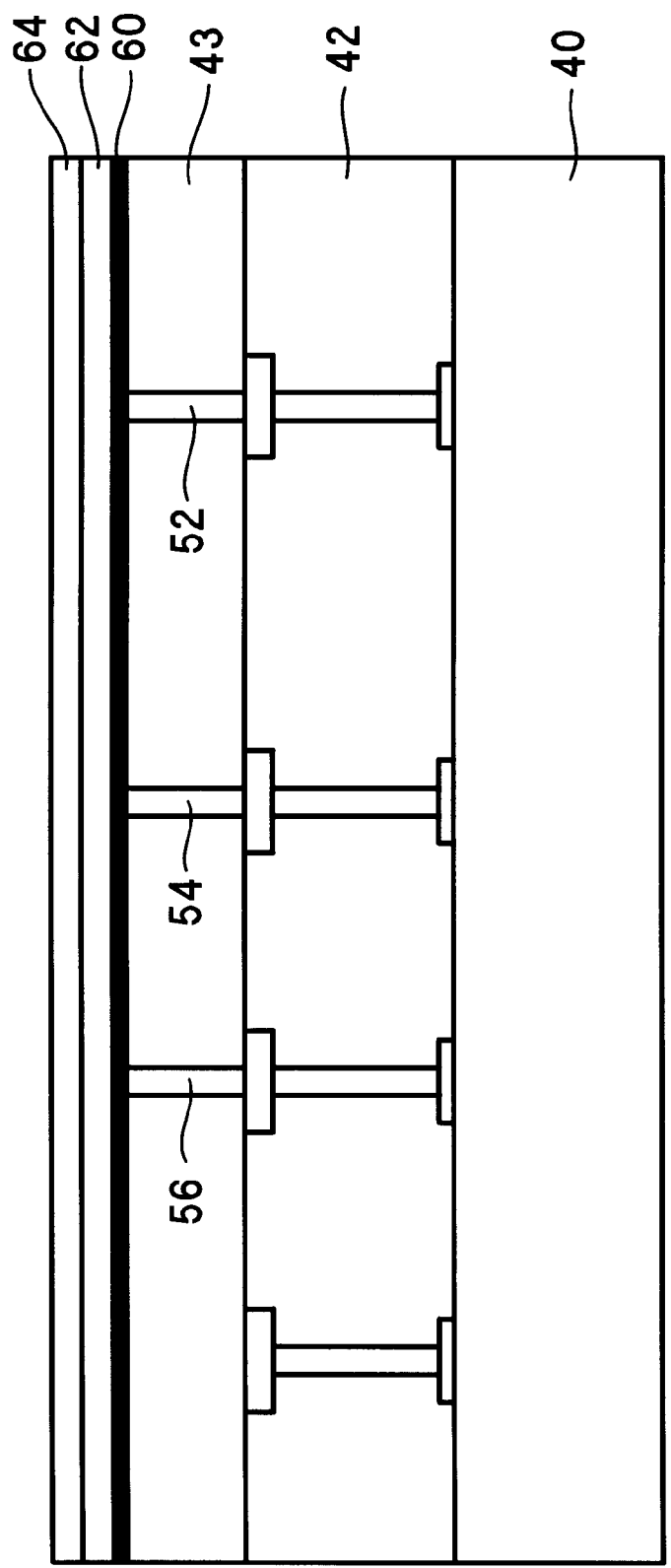
FIG. 12 shows an inner metal layer, a pixel electrode layer, and an I-layer deposited over the pixel interconnect structure of FIG. 4.

FIG. 12 shows an inner metal layer 60, a pixel electrode layer 62, and an I-layer 64 deposited over the pixel interconnect structure 43. The inner metal layer 60 is typically deposited by a sputtering process. The pixel electrode layer 62 is typically deposited using a PECVD process. The PECVD process is performed with a phosphorous containing gas. The phosphorous containing gas can be $PH_3$. A silicon containing gas, such as $Si_2H_6$ or $SiH_4$, is included when forming amorphous silicon pixel electrodes 44. The I-layer 64 is generally deposited using a PECVD process or reactive sputtering process. The PECVD process must include a silicon containing gas. The deposition should be at a low enough temperature that hydrogen is retained within the film.

Figure 13:
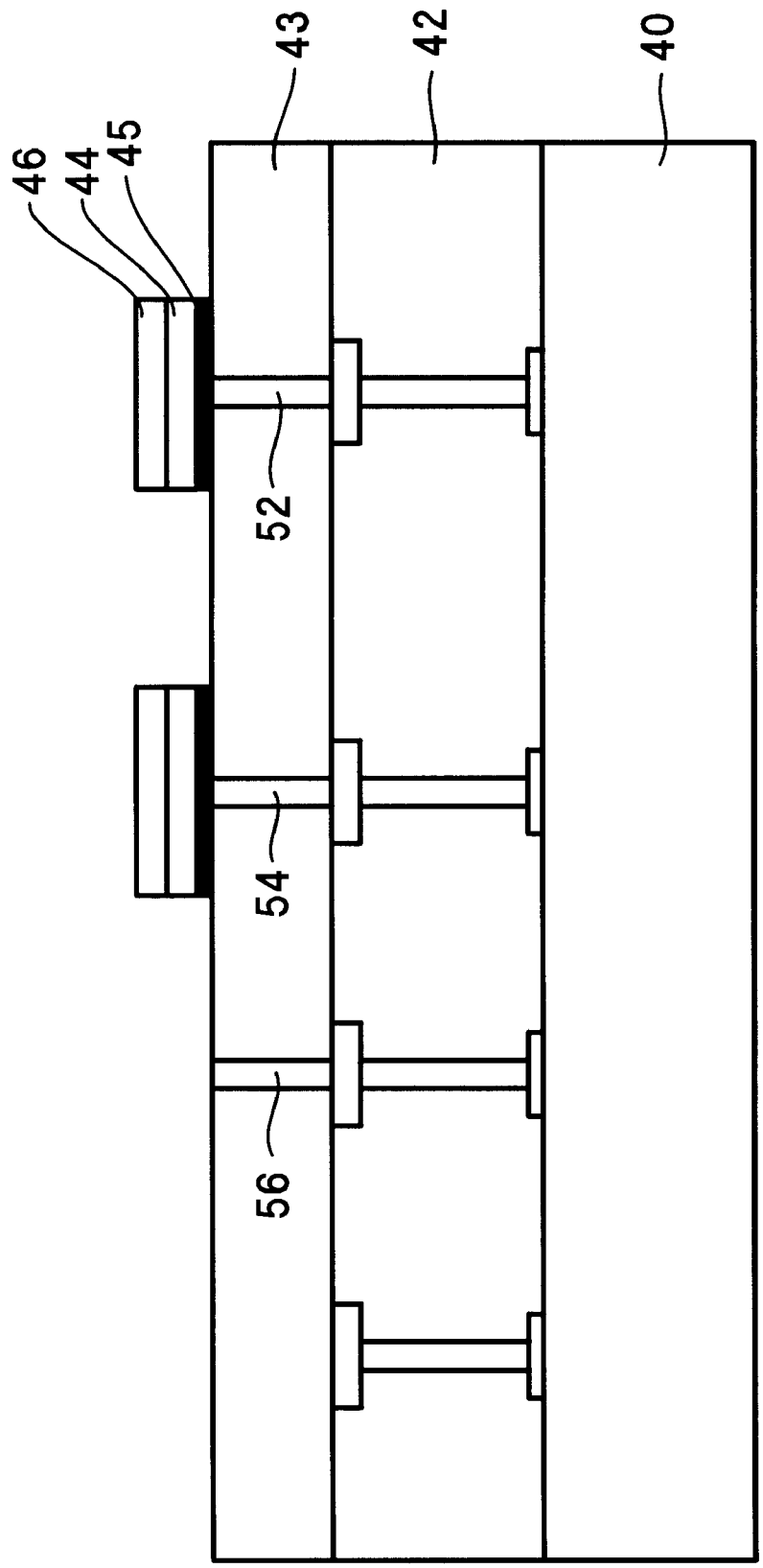
FIG. 13 shows the inner metal layer, the pixel electrode layer and the I-layer having been etched forming the image sensors according to a predetermined pattern.

FIG. 13 shows the inner metal layer 60, the pixel electrode layer 62 and the I-layer 64 having been wet or dry etched forming the image sensors according to a predetermined pattern.

Figure 14:
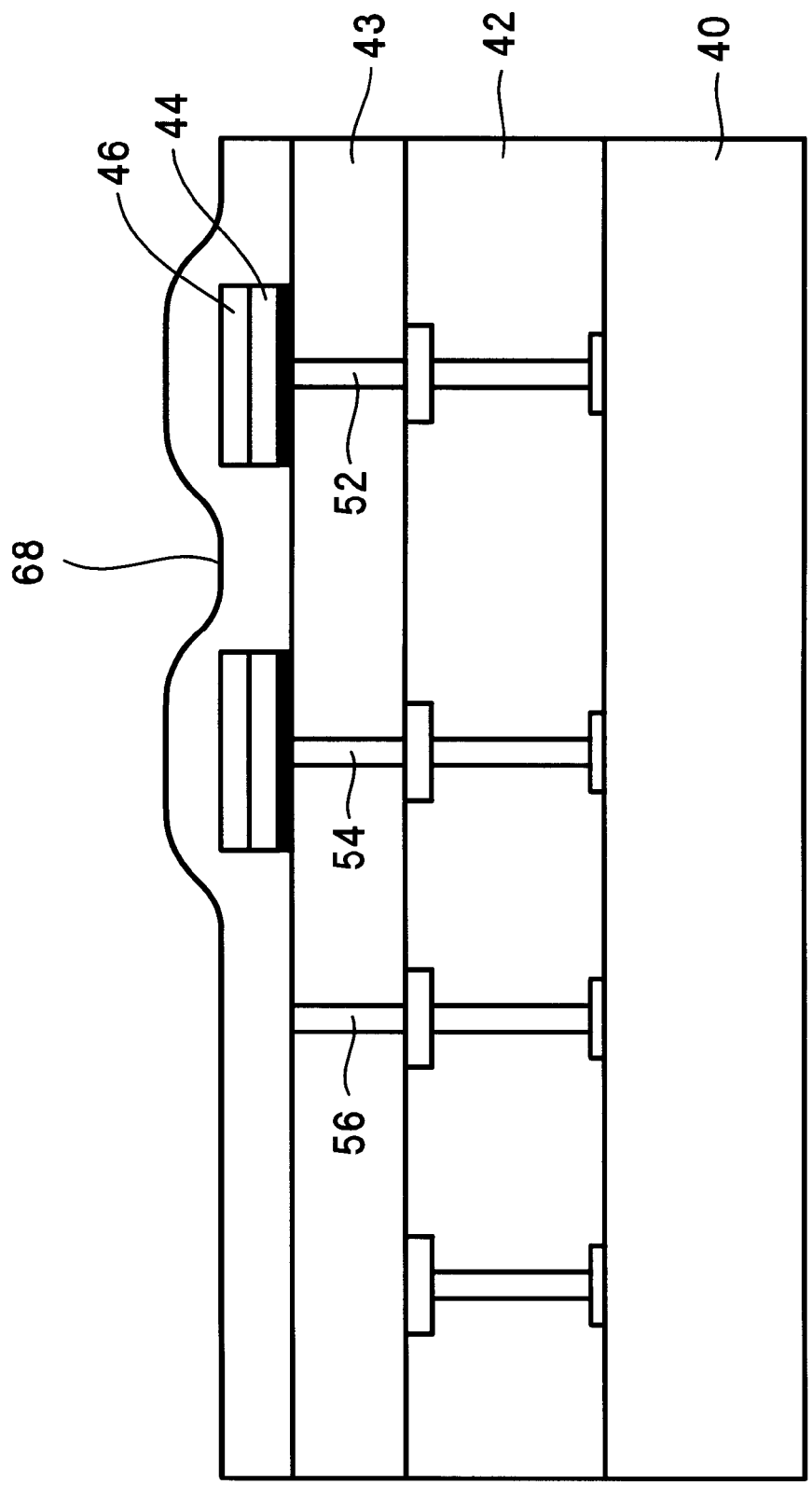
FIG. 14 shows the deposition of an insulating layer 68.

FIG. 14 shows the deposition of an insulating layer 68. The insulating layer 68 is deposited by a PECVD process. The insulating layer 68 is typically formed from $SiO_2$, $Si_3N_4$ or a combination of $SiO_2$ and $Si_3N_4$. The insulating layer 68 fills in gaps between the image sensors and is used to form the insulating regions 55.

Figure 15:
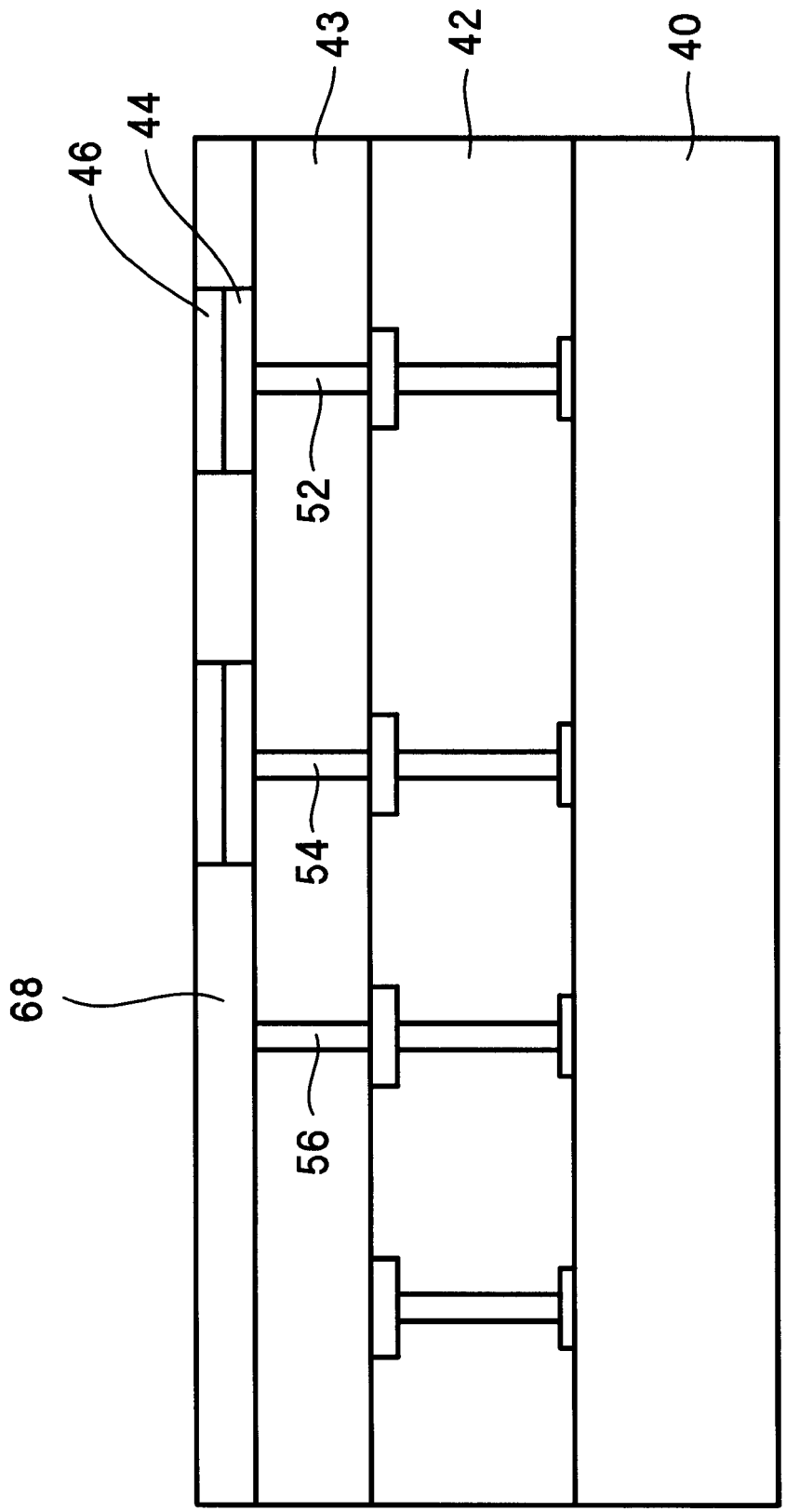
FIG. 15 shows the insulating layer having been polished.

FIG. 15 shows the insulating layer 68 having been polished or etched.

Figure 16:
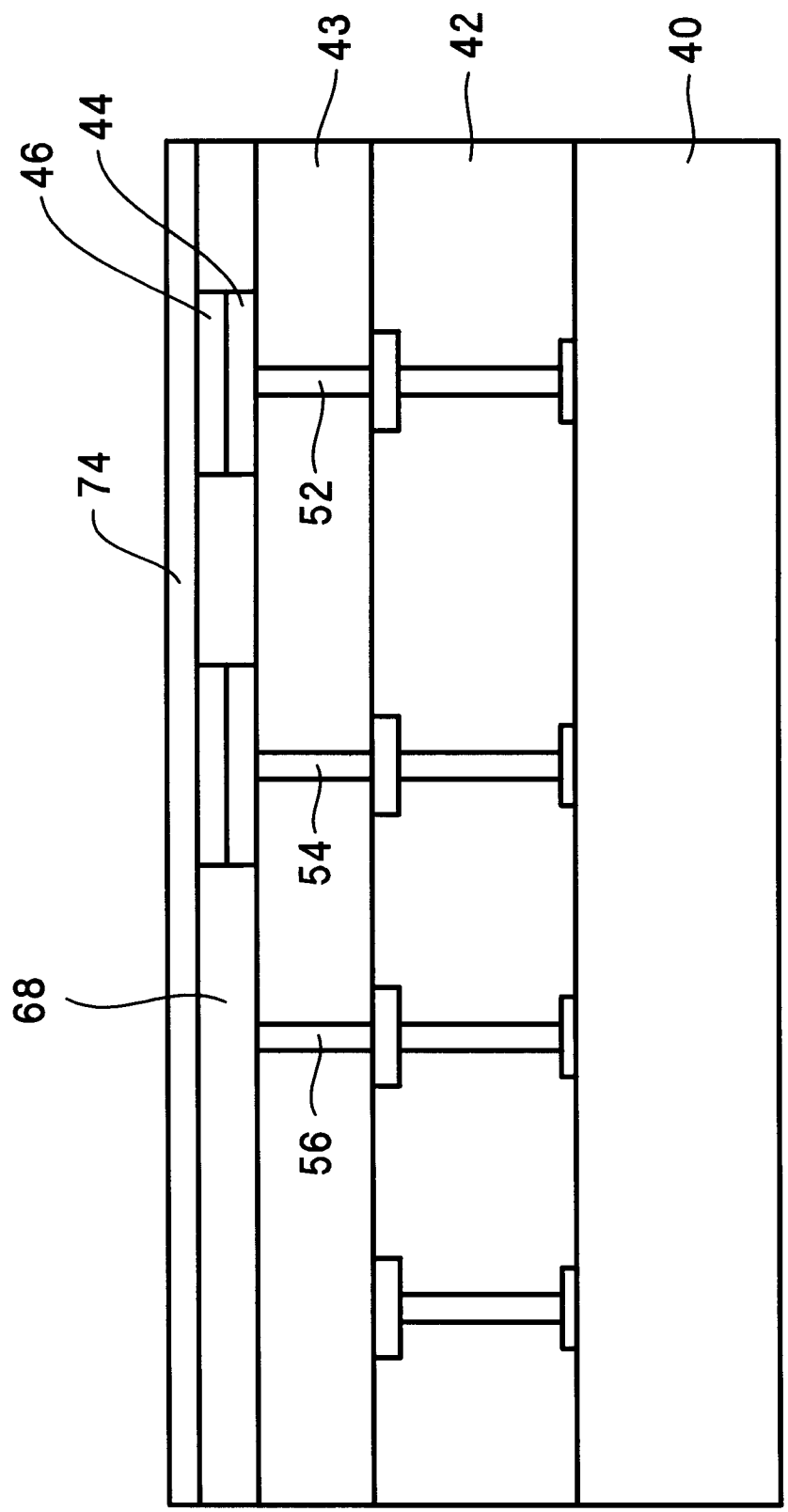
FIG. 16 shows a P-layer having been deposited.

FIG. 16 shows a P-layer 74 having been deposited. The P-layer 74 can be deposited using a PECVD process. The PECVD process is performed with a Boron containing gas. The Boron containing gas can be $B_2H_6$. A silicon containing gas is included when forming an amorphous silicon P-layer 74.

Figure 17:
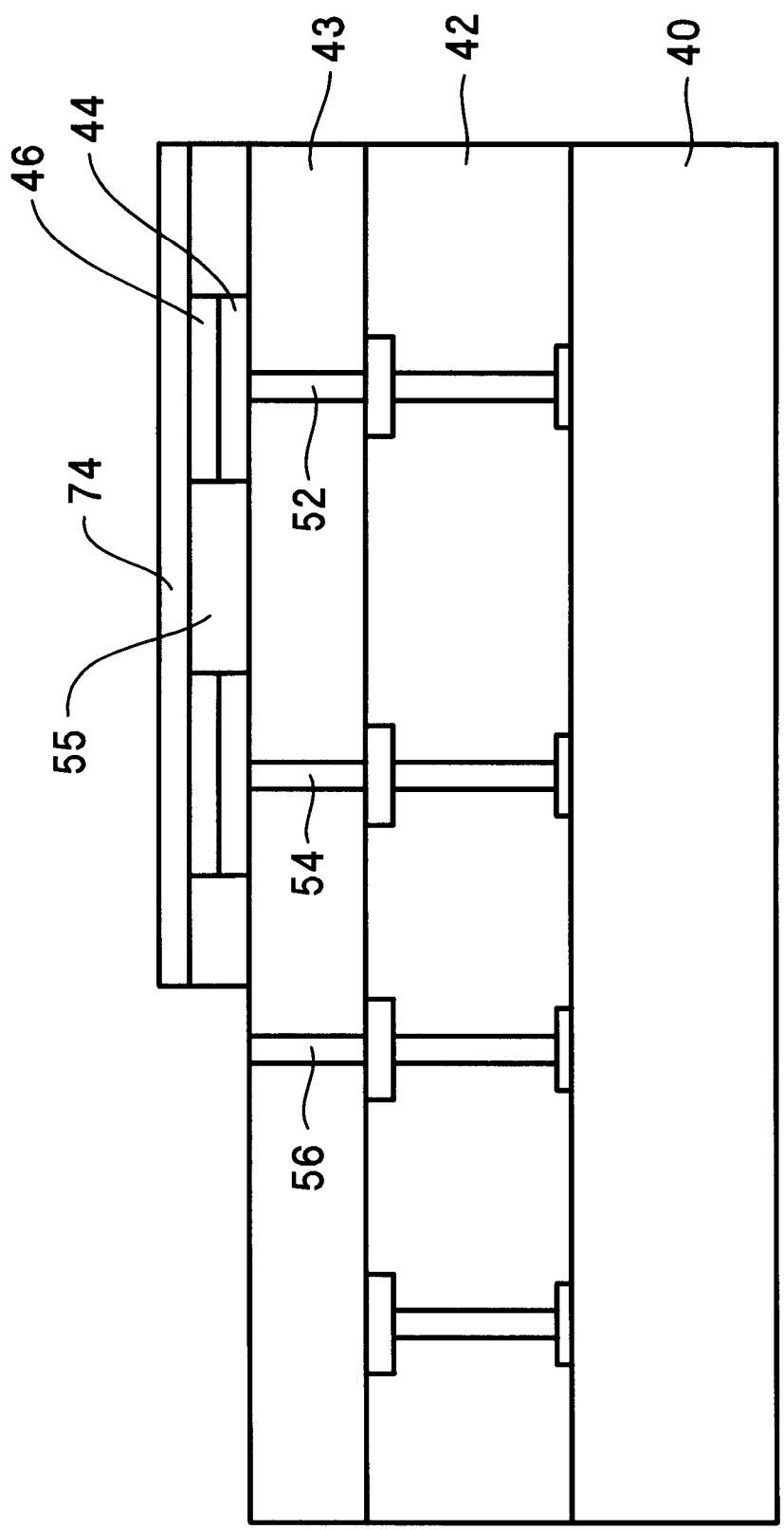
FIG. 17 shows the insulating layer and the P-layer having been etched providing access to the third conductive via.

FIG. 17 shows the insulating layer 68 and the P-layer 74 having been etched providing access to the third conductive via 56, and forming the insulating regions 55.

Figure 18:
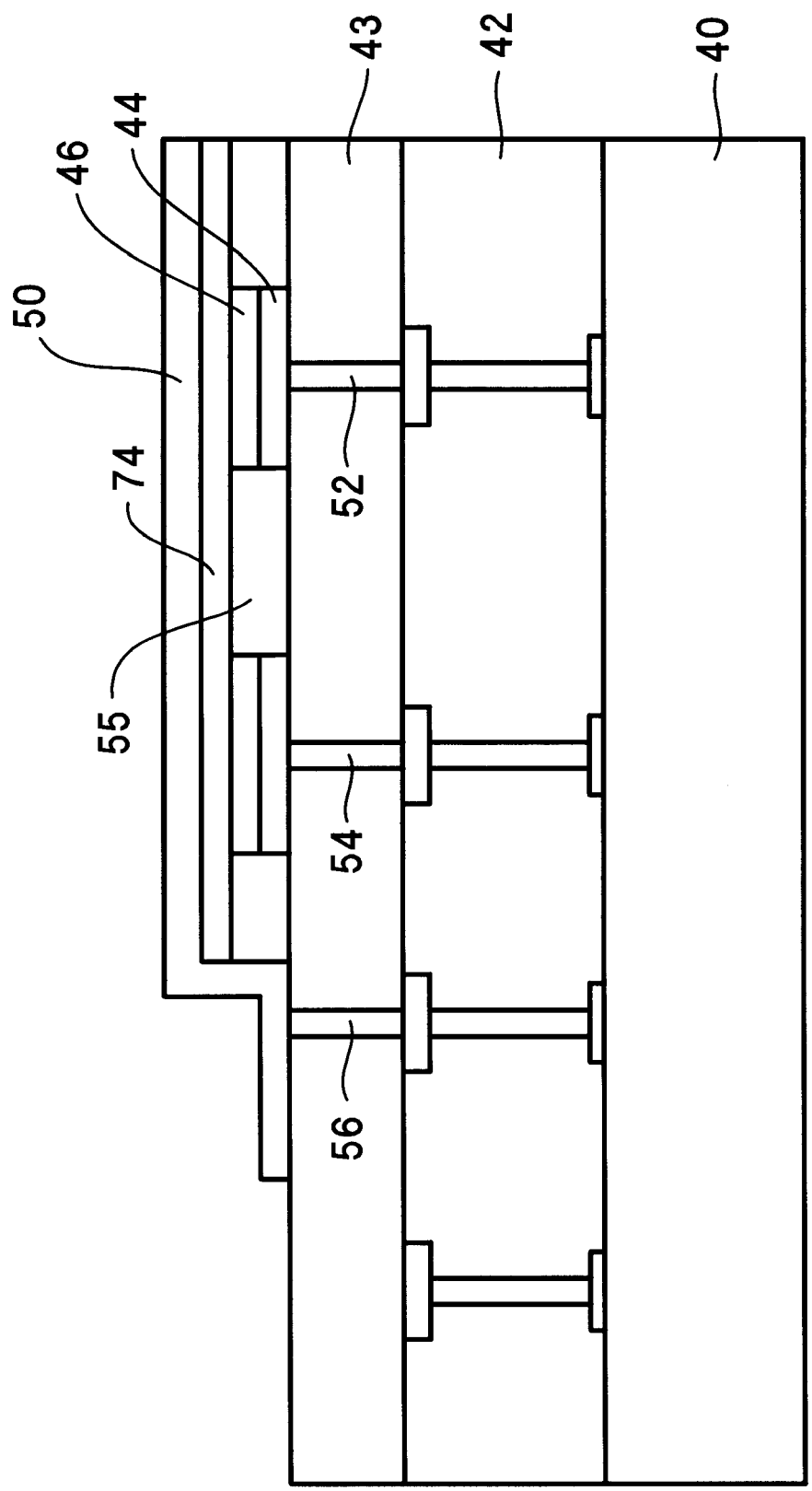
FIG. 18 shows the transparent conductive layer deposited over the P-layer which provides an electrical connection between the P-layer sections and the third conductive via.

FIG. 18 shows the transparent conductive layer 50 deposited over the P-layer 74 which provides an electrical connection between the P-layer 74 and the third conductive via 56. Generally, the transparent conductor 50 is formed from an indium tin oxide. However, the transparent conductor 50 can also be formed from titanium nitride, thin silicide, or certain types of transition metal nitrides or oxides.

The transparent conductive layer 50 is generally deposited through reactive sputtering. However, the transparent conductive layer 50 can also be grown by evaporation. If the transparent conductive layer 50 is formed from titanium nitride, then typically a CVD process or a sputtering process must be used to deposit the transparent conductive layer 50.

Figure 19:
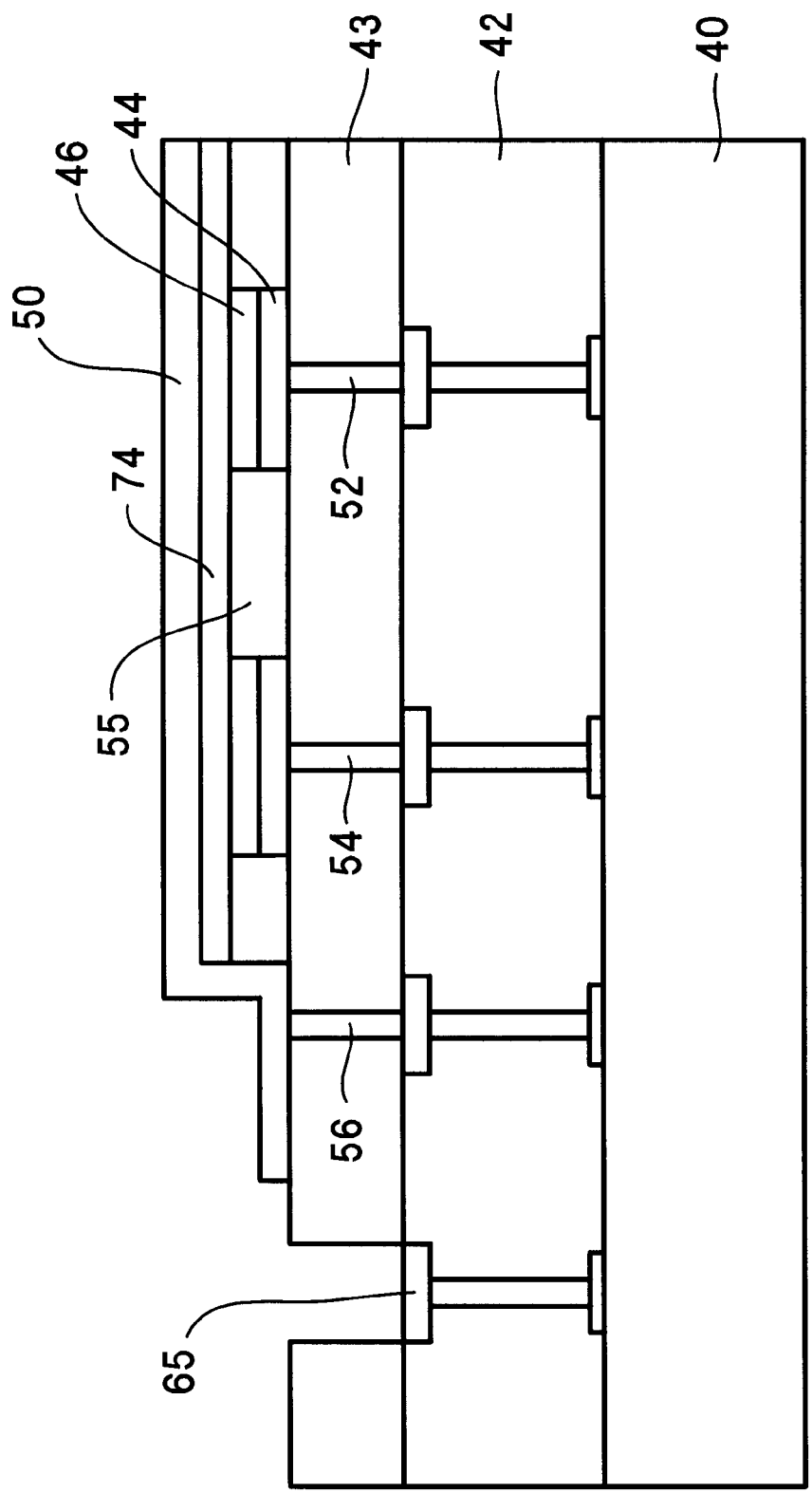
FIG. 19 shows the transparent conductive layer and the pixel interconnect structure having been etched according to a predetermined pattern.

FIG. 19 shows the transparent conductive layer 50 and the pixel interconnect structure 43 having been etched according to a predetermined pattern. This etching allows access to a bonding pad 65 of the interconnection structure 40.

As stated previously, a protective layer may be formed over the transparent conductor 50. The protective layer provides mechanical protection, electrical insulation, and can provide some anti-reflective characteristics.

Although specific embodiments of the invention have been described and illustrated, the invention is not to be limited to the specific forms or arrangements of parts so described and illustrated. The invention is limited only by the claims.

What is claimed:

1. An image sensor array comprising:
    a substrate;
    an interconnect structure adjacent to the substrate;
    a plurality of image sensors formed adjacent to the interconnect structure, each image sensor comprising:
        a pixel electrode;
        a separate I-layer section formed adjacent to the pixel electrode;
    the image sensor array further comprising:
        an insulating material between each image sensor; and
        a transparent electrode formed over the image sensors, an inner surface of the transparent electrode electrically connected to an outer surface of the image sensors and the interconnect structure.

2. The image sensor array as recited in claim 1, wherein each image sensor further comprises a separate P-layer section formed adjacent to the I-layer section.

3. The image sensor array as recited in claim 1, wherein each image sensor further comprises a P-layer wherein the P-layer extends adjacently to a plurality of separate I-layer sections.

4. The image sensor array as recited in claim 1, wherein each pixel electrode comprises an N-layer.

5. The image sensor array as recited in claim 1, wherein the interconnect structure electrically interconnects the pixel electrodes to the substrate.

6. The image sensor array as recited in claim 1, wherein the I-layer sections and the pixel electrodes comprise amorphous silicon.

7. The image sensor array as recited in claim 2, wherein each P-layer section comprises amorphous silicon.

8. The image sensor array as recited in claim 3, wherein the P-layer comprises amorphous silicon.

9. The image sensor array as recited in claim 1, wherein the inner surface of the transparent electrode is electrically connected to the interconnect structure through a tungsten plug.

10. The image sensor array as recited in claim 1, wherein the transparent electrode comprises indium tin oxide.

11. The image sensor array as recited in claim 1, wherein the substrate comprises CMOS.

12. The image sensor array as recited in claim 1, wherein the substrate comprises active circuits which sense charge accumulated by the image sensors due to the image sensors receiving light.

13. The image sensor array as recited in claim 1, wherein the substrate comprises charge coupled devices.

14. The image sensor array as recited in claim 1, wherein the inner surface of the transparent electrode is electrically connected to the interconnect structure through a plurality of tungsten plugs.

15. The image sensor array as recited in claim 1, wherein each pixel electrode comprises a P-layer.

16. The image sensor array as recited in claim 15, wherein each image sensor further comprises a separate N-layer section formed adjacent to the I-layer section.

17. The image sensor array as recited in claim 15, wherein each image sensor further comprises a N-layer wherein the N-layer extends adjacently to a plurality of separate I-layer sections.

\* \* \* \* \*